United States Patent [19]
Iwabuchi

[11] Patent Number: 6,022,418
[45] Date of Patent: Feb. 8, 2000

[54] VACUUM PROCESSING METHOD

[75] Inventor: Katsuhiko Iwabuchi, Sagamihara, Japan

[73] Assignee: Tokyo Electron Limited, Tokyo, Japan

[21] Appl. No.: 09/017,226

[22] Filed: Feb. 2, 1998

[30] Foreign Application Priority Data

Feb. 5, 1997 [JP] Japan ................................. 9-037164

[51] Int. Cl.[7] ................................................. B05C 13/00
[52] U.S. Cl. ........................... 118/728; 118/500; 156/345; 279/128; 361/234
[58] Field of Search ................................ 118/728, 500; 156/345; 279/128; 361/234

[56] References Cited

U.S. PATENT DOCUMENTS

| | | | |
|---|---|---|---|
| 5,236,511 | 8/1993 | Etzkorn et al. | 118/723 |
| 5,735,993 | 4/1998 | Yoshida | 156/345 |
| 5,922,223 | 7/1999 | Okumura et al. | 219/121.43 |

*Primary Examiner*—Blaine Copenheaver
*Attorney, Agent, or Firm*—Smith, Gambrell & Russell, LLP

[57] ABSTRACT

In a vacuum processing apparatus for a semiconductor wafer, a first dielectric plate 4 is provided over an O-ring 32 on an upper surface of a main mounting stand unit 31, in which is embedded a coolant passageway 34, the upper surface thereof is configured as an electrostatic chuck, and a second dielectric plate 5 in which is embedded a heater 53 is provided thereon. Recesses and projections are machined into the surface of the first dielectric plate 4 so that crevices are formed between the resultant indentations 41 and the second dielectric plate 5. During the formation of an SiOF film, the heat from the heater 53 is not conducted through these crevices in a vacuum environment, so that the thermal conductivity between the second dielectric plate 5 and the first dielectric plate 4 is reduced and thus the temperature gradient therebetween is increased. Since the rear surface side of the first dielectric plate 4 is at no more than 200° C., the O-ring is not subjected to a high temperature. This configuration suppresses deterioration of the O-ring, even during high-temperature processing, and also prevents breakdown of the insulating properties of an insulating film formed on a semiconductor wafer.

7 Claims, 6 Drawing Sheets

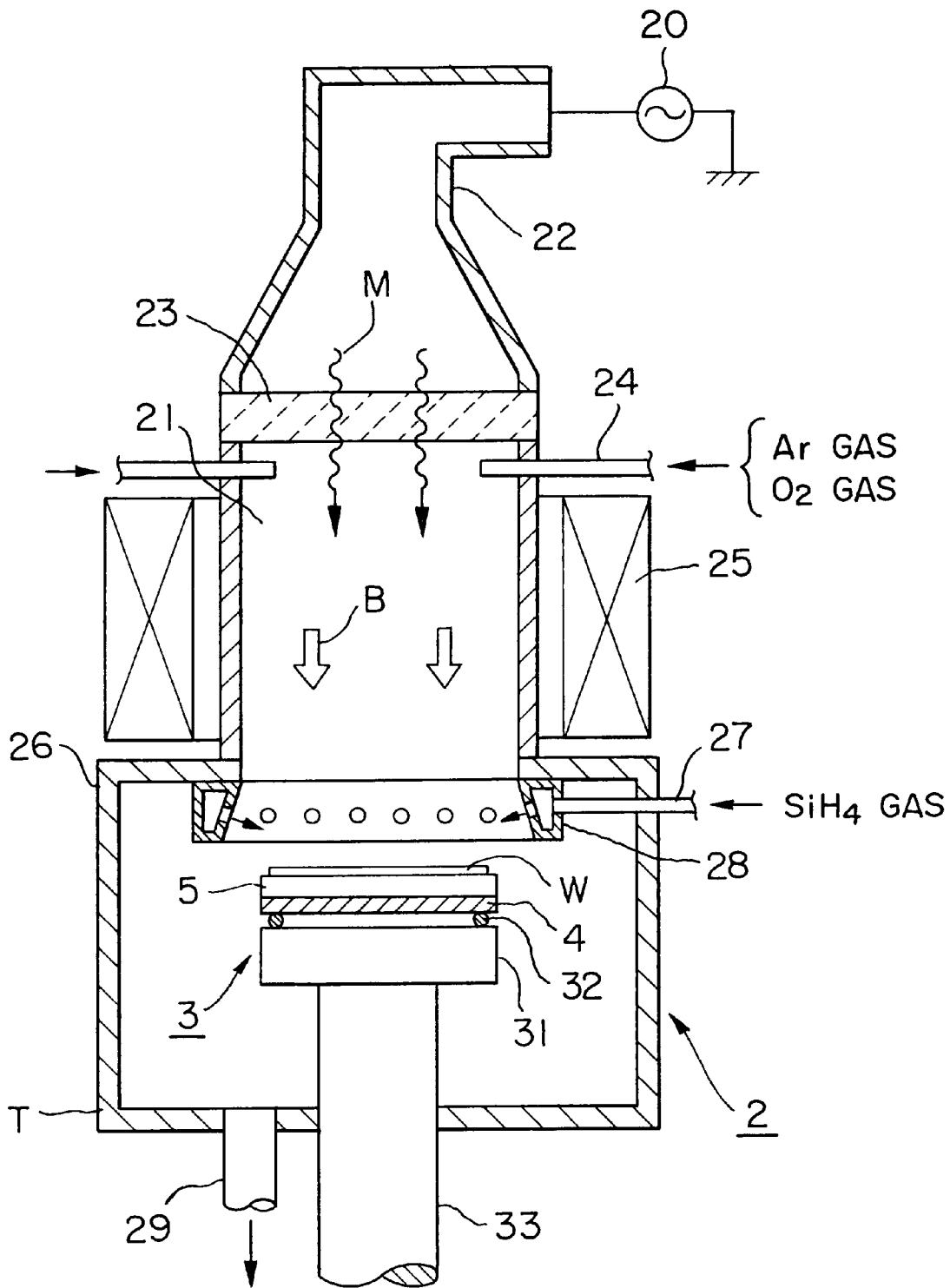
F I G. 1

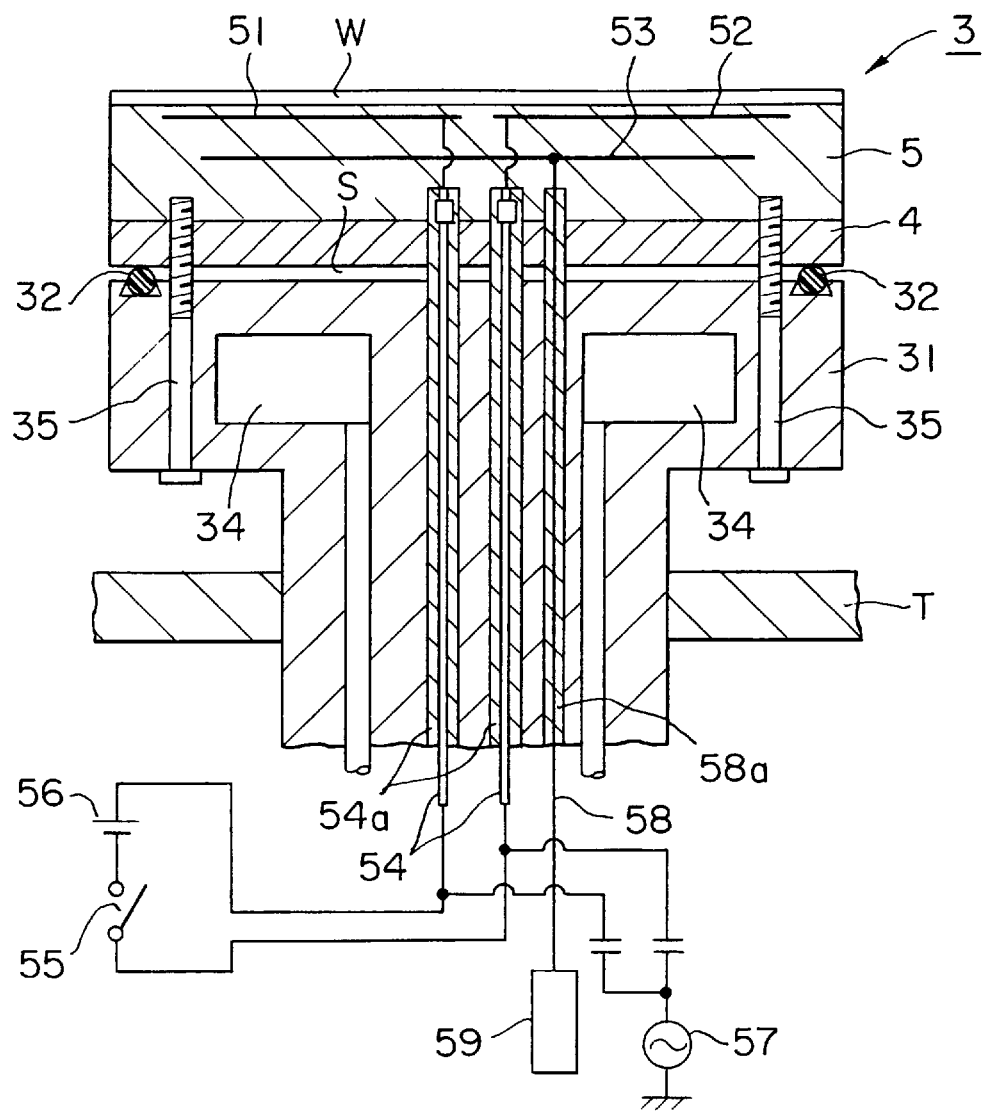
F I G. 2A
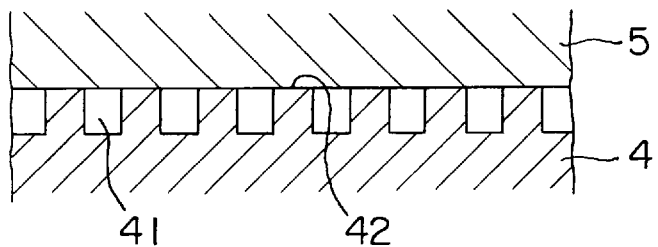
F I G. 2B

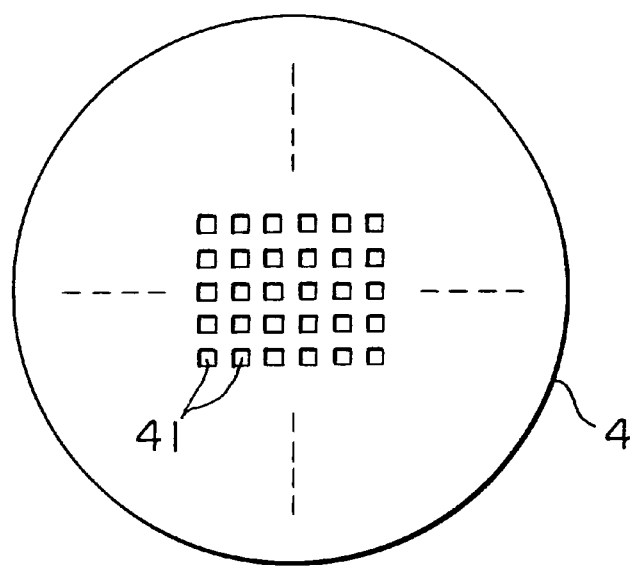
F I G. 3A
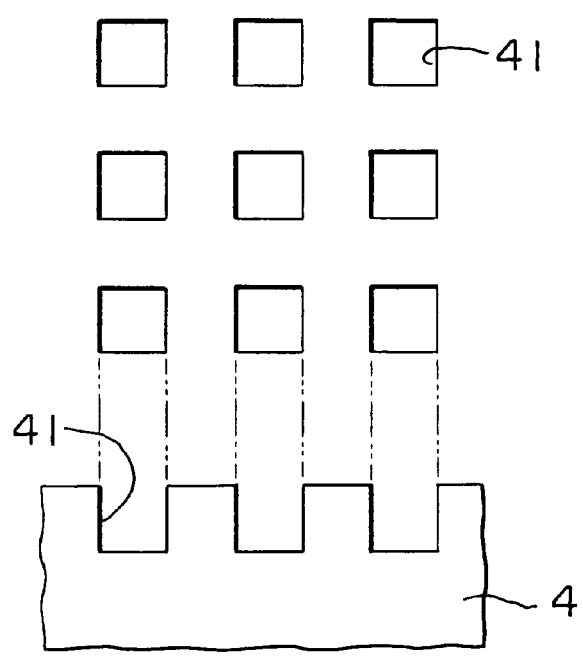
F I G. 3B

VACUUM PROCESSING METHOD

BACKGROUND OF THE INVENTION

The present invention relates to a vacuum processing apparatus that is used to subject a substrate to be processed, such as a semiconductor wafer, to a vacuum process.

Various steps in the formation of an integrated circuit on a semiconductor wafer are performed in a vacuum, such as film formation and etching. In such vacuum processing, the wafer is mounted onto a mounting stand within a vacuum chamber but, in order to maintain the wafer at a predetermined uniform temperature by a temperature adjustment means provided within the mounting stand, it is necessary to press the wafer against the mounting stand. Since it is not possible to use a vacuum chuck in a vacuum, another type of chuck such as an electrostatic chuck is used for attracting the wafer to the surface of the mounting stand by an electrostatic force, and holding it there.

A conceptual view of the entire structure of a vacuum processing apparatus, including a mounting stand, is shown in FIG. 7, taking a plasma processing apparatus that uses electron cyclotron resonance (ECR) by way of example. This vacuum processing apparatus supplies microwaves at, for example, 2.45 GHz into a plasma generation chamber 1A through a waveguide 11 and produces a magnetic field at, for example, 875 Gauss therein by an electromagnetic coil 12, so that the mutual actions of the microwaves and the magnetic field turn a plasma generation gas, such as argon or oxygen, into a high-density plasma. A reaction gas such as SiH4, which is introduced into a film-formation chamber 1B, is activated by this plasma to form a thin film on the surface of a semiconductor wafer W.

A mounting stand 10 used in this apparatus is configured so that a dielectric plate 15 is provided on an upper surface of a main mounting stand unit 13, which is made of a material such as aluminum, with an O-ring 14 made of a material such as fluoro-rubber therebetween. This dielectric plate 15 is provided internally with metal electrodes 16 of, for example, tungsten in the vicinity of the surface thereof, so that the surface portion is configured as an electrostatic chuck. Coolant passages (not shown in the figure) are also provided within the main mounting stand unit 13, and a heater 17 consisting of, for example, tungsten electrodes is provided within the dielectric plate 15. Since this mounting stand 10 will be disposed within a vacuum, the region enclosed by the O-ring 14 between the main mounting stand unit 13 and the dielectric plate 15 is arranged in such a manner that helium is supplied thereto to maintain a uniform thermal conductivity.

The thus configured mounting stand 10 is designed to attract and hold the wafer W to the mounting surface, as described above, but it also fulfills the role of heating the wafer W to a predetermined temperature and achieves a reference temperature by means of a coolant, so that the wafer is always controlled to have a constant temperature by the combination of that coolant and the heater 17.

However, since semiconductor devices are now being designed to operate at even faster speeds, the formation of an SiOF film, which has a lower permittivity than an SiO2 film, is being promoted for the inter-layer insulation films thereof. This SiOF film can be formed by the above described ECR plasma apparatus, but the processing is at a higher temperature than that for an SiO2 film and thus the temperature of the surface of the dielectric plate 15 reaches 320 to 330° C. during the processing.

Since the dielectric plate 15 is a sintered body, it is difficult to construct to a greater thickness, so the thickness thereof is limited to at most about a dozen mm. In such a case, if the surface of the dielectric plate 15 is heated by the heater 17 to approximately 320° C., the temperature of the rear surface side of the dielectric plate 15 on which the O-ring 14 is provided reaches approximately 300° C. but, since the O-ring 14 is a resin product with a thermal resistance of no more than 200° C., the O-ring 14 will deteriorate during this processing and the sealing ability thereof will no longer be maintained.

In addition, the insulation resistance of a dielectric body decreases as temperature increases, so that the insulation resistance of the dielectric plate 15 will decrease if the processing temperature is increased, electric charge remaining in the insulating film due to the electrostatic attraction, for example, will escape to ground through the wafer W during the processing, and thus there is a danger that the insulation of the inter-layer insulation film may break down.

The present invention was devised in the light of the above problems and has as an object thereof the provision of a vacuum processing apparatus that can suppress deterioration of the O-ring provided in the mounting stand and prevent breakdown of the insulating properties of an insulating film formed on a substrate to be processed.

SUMMARY OF THE INVENTION

In order to achieve the above objective, the present invention provides a vacuum processing apparatus comprising a vacuum vessel forming a vacuum chamber and a mounting stand for a substrate to be processed, which is provided within the vacuum chamber; wherein the mounting stand for a substrate to be processed comprises a main mounting stand unit; a first dielectric plate supported by a surface of the main mounting stand unit; an annular sealing member interposed between the surface of the main mounting stand unit and the first dielectric plate; and a second dielectric plate supported on a surface of the first dielectric plate and having in the interior thereof a heating means and an electrode for forming an electrostatic chuck for attracting a substrate to be processed.

This first dielectric plate may be configured in such a manner that it has recesses and projections on the surface thereof. Similarly, recesses and projections may be formed in a surface of the second dielectric plate that faces the first dielectric plate.

The second dielectric plate may includes a plurality of mutually stacked plate elements.

In addition, the apparatus may be further provided with a means for supplying a fluid for thermal conduction into a region surrounded by the annular sealing member.

The first dielectric plate and the second dielectric plate may each be supported in a freely removable manner.

BRIEF DESCRIPTION OF THE DRAWINGS

FIG. 1 is a sectional view of a vacuum processing apparatus in accordance with an embodiment of this invention;

FIG. 2A is a sectional view of a mounting stand used in the vacuum processing apparatus of FIG. 1;

FIG. 2B is an enlarged sectional view of part of FIG. 2A;

FIG. 3A is a plan view of an intermediate dielectric plate used by the present invention;

FIG. 3B is an illustrative view of irregularities formed in the surface of the intermediate dielectric plate of FIG. 3A;

DESCRIPTION OF THE PREFERRED EMBODIMENTS

Figure 4:
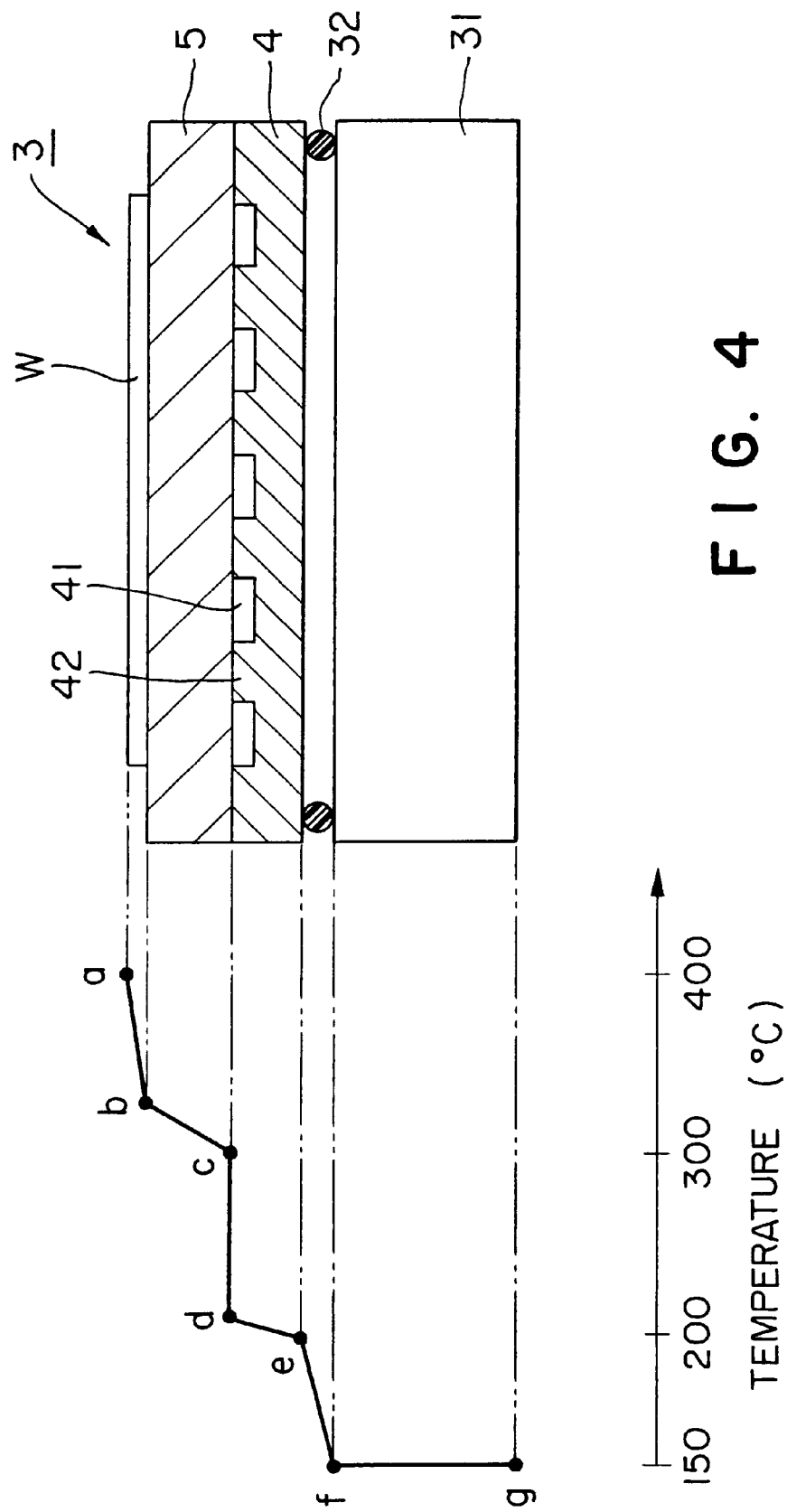
FIG. 4 is an illustrative view of the temperature profile of the mounting stand during the formation of the inter-layer insulation film.

The description below relates to an embodiment of the present invention. This embodiment concerns a vacuum processing apparatus wherein an intermediate dielectric plate is provided between a dielectric plate, in which is embedded a heating means and an electrode for an electrostatic chuck, and an annular sealing member of resin, so that a large insulation resistance is achieved by this intermediate dielectric plate and also the heating means is thermally separated from the sealing member to ensure that the sealing member is not affected by the heat.

A schematic sectional view of an embodiment of the present invention is shown in FIG. 1, wherein this invention is applied to an ECR plasma apparatus by way of example. A sectional view of a mounting stand for a substrate to be processed, such as a semiconductor wafer (hereinafter abbreviated to "wafer"), is shown in FIG. 2.

The description first deals in a simple manner with the overall configuration of the ECR plasma apparatus. This apparatus is configured in such a manner that microwaves M at, for example, 2.45 GHz from a high-frequency power source 20 are guided from a waveguide 22 through a permeable window 23 into a plasma chamber 21 on an upper side of a vacuum vessel 2. A plasma gas such as argon or oxygen is supplied into the plasma chamber 21 from a plasma gas nozzle 24, and electron cyclotron resonance is generated by the application of a magnetic field B by an electromagnetic coil 25 provided on the outside of the plasma chamber 21. The configuration is further such that a reactive gas is supplied into a reaction chamber 26 at a lower side of the vacuum vessel 2 through a reactive gas supply portion 28 into which extends a reaction gas nozzle 27. An exhaust pipe 29 is connected to a bottom portion of the reaction chamber 26.

A mounting stand 3 for holding a semiconductor wafer (hereinafter abbreviated to "wafer") that is the substrate to be processed is provided in a freely elevatable manner in the interior of the reaction chamber 26. This mounting stand 3 is provided with, for example, a first dielectric plate 4 that is an intermediate dielectric plate on a main mounting stand unit 31 with an O-ring 32 that forms an annular sealing member therebetween, and a second dielectric plate 5, in that order. The mounting stand 3 is disposed on an upper portion of a circular cylindrical support member 33. The support member 33 is disposed in such a manner that it penetrates through a bottom wall T of the vacuum vessel 2, and is configured to be capable of being raised and lowered while maintaining a seal with respect to the vacuum vessel 2. Note that, in general, the above dielectric bodies include semiconductors, in addition to insulating bodies.

The description now turns to details of the mounting stand 3, with reference to FIG. 2A. The main mounting stand unit 31 is constructed of a material such as aluminum, and a coolant passageway 34 for allowing the passage of a coolant is provided in the interior thereof. The temperature of this coolant can be adjusted accurately to, for example, 150° C., to fulfills the role of making the surface of the main mounting stand unit 31 a uniform reference-temperature surface. The O-ring 32 is constructed of a resin such as fluoro-rubber, and a sealed space S surrounded by the O-ring 32 is formed between the upper surface of the main mounting stand unit 31 and the lower surface of the first dielectric plate 4 by the O-ring 32.

In this case, the upper surface of the main mounting stand unit 31 and the lower surface of the first dielectric plate 4 are not completely smooth and have very small irregularities formed therein, so that small crevices are formed by the irregularities on the two surfaces. These crevices are in a state in which a thermally conductive gas, such as helium, is sealed therein at a positive pressure with respect to the vacuum environment, such as at a pressure of 300 Torr. This helium conducts heat uniformly to the first dielectric plate 4 to set the surface of that first dielectric plate 4 to a uniform temperature, so that this surface acts as a uniform reference-temperature surface.

This first dielectric plate 4 is configured as a circular plate of, for example, a thickness of 3 mm and a diameter of 205 mm (when an 8-inch wafer is to be processed) from a dielectric body of a material such as aluminum nitride (AlN), alumina ($Al_2O_3$), or quartz, and recesses 41 and projections 42 of a predetermined shape are machined into the plate surface that is the portion thereof in contact with the second dielectric plate 5, as shown by way of example in FIG. 2B. These recesses 41 and projections 42 influence thermal conduction, as will be described later. They can be set arbitrarily in accordance with requirements, and are formed as square indentations or recesses 41 in a large array in mutually perpendicular directions in the surface of the first dielectric plate 4, as shown for example in FIG. 3A, in such a manner that upper surfaces of the projections 42 come into direct contact with the lower surface of the second dielectric plate 5. The recesses 41 are 0.5 mm in all directions and of 0.5 mm deep, as shown by way of example in FIG. 3B, and a large number thereof are arranged in an array at a spacing of 0.5 mm, for example, between recesses 41 that are adjacent in the mutually perpendicular directions.

The second dielectric plate 5 is formed in the form of a circular plate of a material such as AlN having a thickness of 15 mm and a diameter of 205 mm, for example, a pair of electrodes 51 and 52 for attraction and a heater 53 that is a heating means are embedded therein, and the surface of the second dielectric plate 5 is configured as an electrostatic chuck. The electrodes 51 and 52 are formed of a material such as tungsten foil and are embedded at positions close to the surface of the second dielectric plate 5. A DC power source 56 for the electrostatic chuck is connected by supply wiring 54 to these electrodes 51 and 52, with a switch 55 therebetween. A high-frequency power source 57 is connected thereto in such a manner that a bias voltage for drawing ions towards the wafer W is applied thereto. The heater 53 is formed of an electrode of a material such as tungsten, and a DC power source 59 is connected to the heater 53 by supply wiring 58. Note that each wire of the supply wiring 54 and 58 is incorporated within a cylindrical sheath 54a or 58a.

The mounting stand 3 is configured in such a manner that the various members thereof are connected together in a freely removable manner by screws 35 engaging with screwholes formed to penetrate through the main mounting stand unit 31 and the first dielectric plate 4 and reach the lower side of the second dielectric plate 5.

The description now turns to the operation of the above embodiment, taking as an example the formation of an SiOF film that is an inter-layer insulation film on the wafer W. First of all, a wafer W is transferred onto the second dielectric plate 5 of the mounting stand 3, which is a transfer position for the wafer W, by a conveyor arm (not shown in the figure) from a load-lock chamber (not shown in the figure) by the cooperative action of lift pins (not shown in the figure) that are incorporated within the mounting stand 3, a voltage is applied to the electrodes 51 and 52 of the second dielectric plate 5, and thus the wafer W is attracted electrostatically onto that dielectric plate 5.

The mounting stand 3 is then raised by the support member 33 to a processing position and the temperature of the wafer W is raised to a predetermined temperature, such as 320° C. by the combination of the coolant in the coolant passageway 34 and the heater 53. At the same time, a predetermined quantity of a plasma gas such as argon or oxygen is introduced from the plasma gas nozzle 24 and a predetermined quantity of a reactive gas is introduced from the reaction gas nozzle 27, while the interior of the vacuum vessel 2 is maintained at a predetermined degree of vacuum by the exhaust pipe 29. An SiOF film is then formed on the wafer W by this reactive gas that has been activated by the plasma ions flowing into the reaction chamber 26.

During this time, the second dielectric plate 5 of the mounting stand 3 is heated by the heater 53 and, at the same time, the temperature of the main mounting stand unit 31 is adjusted to approximately 150° C. by the coolant in the coolant passageway 34, so that the heat from the heater 53 is conducted towards the first dielectric plate 4 and also the coolant heat from the main mounting stand unit 31 is conducted towards the first dielectric plate 4 through the helium. Therefore, the mounting stand 3 is made to have a temperature profile during the formation of the SiOF film such as that shown in FIG. 4 by way of example, due to the mutual actions of thermal conduction from the second dielectric plate 5 and thermal conduction from the main mounting stand unit 31.

To describe this temperature profile, a in FIG. 4 denotes the temperature of the surface of the wafer W (400° C.), b denotes the temperature of the upper surface of the second dielectric plate 5 (320° C.), c denotes the temperature of the rear or lower surface of the second dielectric plate 5 (300° C.), d denotes the temperature of the upper surface of the first dielectric plate 4 (210° C.), e denotes the temperature of the rear or lower surface of the first dielectric plate 4 (200° C.), f denotes the temperature of the upper surface of the main mounting stand unit 31 (150° C.), and g denotes the temperature of the rear or lower surface of the main mounting stand unit 31 (150° C.).

In the thus configured mounting stand 3, there is an abrupt drop in temperature of approximately 90° C. in the connection portions between the second dielectric plate 5 and the first dielectric plate 4, and the reason why the temperature gradient in these portions becomes so high is given below. That is to say, the total thermal transfer would be by thermal transfer through the surface-to-surface contact and thermal transfer through the gas, but the regions of the recesses 41 between the second dielectric plate 5 and the first dielectric plate 4 form crevices in the vacuum environment so that substantially no thermal transfer occurs. Furthermore, the contact surface area between the upper surfaces of the protrusions 42 of the first dielectric plate 4 and the rear or lower surface of the second dielectric plate 5 is extremely small, and also these crevices also form a vacuum environment, so that the thermal transfer is extremely small. This means that the total thermal transfer between the two members is small, and thus the amount of heat transferred from the second dielectric plate 5 to the first dielectric plate 4 is reduced and, as a result, the temperature gradient between the two is increased.

In this manner, the thermal conductivity between the second dielectric plate 5 and the first dielectric plate 4 is reduced by the presence of the crevices, and thus the formation of the recesses 41 of the above mentioned dimensions ensures that the temperature of the rear or lower surface of the first dielectric plate 4 can be kept to no more than 200° C. during the formation of the SiOF film, even though the thickness of the first dielectric plate 4 is approximately 4 mm. In addition, the thermal conductivity between these two members can be controlled by adjusting the surface area of the protrusions 42, so that the temperature of the portions in contact with the O-ring 32 can be kept to no more than 200° C., while the thickness of the first dielectric plate 4 can be controlled, even during high-temperature processing.

Therefore, the O-ring 32 is positioned between a surface in the vicinity of 200° C. and a surface at 150° C. (the surface of the main mounting stand unit 31), so that the O-ring 32 itself is at a temperature that is much lower than 200° C. and thus the O-ring 32 can be prevented from deteriorating and, as a result, the sealing capability thereof can be maintained.

Since the thermal conductivity from the second dielectric plate 5 to the first dielectric plate 4 is so low, the second dielectric plate 5 can be heated efficiently by the heat from the heater 53, so that the consumption of electrical power can be reduced even when the temperature of the vacuum vessel 2 is as high as approximately 320° C.

If it is assumed at this point that no recesses and protrusions are formed in the surface of the first dielectric plate 4, the second dielectric plate 5 and the first dielectric plate 4 will be in direct contact over the entire surfaces thereof so that the contact portion thereof will be much greater than in the case in which the recesses and projections are formed, and hence the thermal conductivity thereof will increase, even if very small crevices are formed in the contact portion. Therefore, since the temperature gradient between these two members is reduced, the thickness of the first dielectric plate 4 must be increased to ensure that the rear surface of that dielectric plate 4 is at no more than 200° C. It is therefore advantageous to machine the recesses and projections into the rear surface of the first dielectric plate 4, as described above.

The degree of thermal conduction in the above described mounting stand 3 can also be controlled by the shape of the recesses and projections formed in the first dielectric plate 4. For example, peripheral regions of the first dielectric plate 4 and the second dielectric plate 5 are brought into contact by the screws thereof, so that the contact surface pressure is stronger in those peripheral regions than in the central regions thereof and thus the thermal conductivity is higher. However, the thermal conductivity within each surface in this case can be made more uniform by, for example, making the surface area of the projections 42 in the central region greater than the surface area of the projections 42 in the peripheral region, so that a highly uniform thermal processing can be performed within that surface.

In addition, since the first dielectric plate 4 which has a higher insulation resistance is provided separate from the second dielectric plate 5 and moreover the temperature of the first dielectric plate 4 is approximately 200 to 210° C., the insulation resistance of the first dielectric plate 4 does not drop very far during the film formation. For this reason, a sufficiently large insulation resistance can be maintained even in a high temperature processing, and insulation breakdown of an SiOF layer on the wafer W can be prevented.

Furthermore, the arrangement in which the first dielectric plate 4 and the second dielectric plate 5 are each provided in a freely removable manner makes it possible to replace just the second dielectric plate 5, which has a shorter lifetime than the first dielectric plate 4, enabling a reduction in cost of the entire mounting stand 3. In other words, the surface of the second dielectric plate 5 is exposed to a plasma and is roughened thereby during a process such as that of film formation, so that the attractive force and the temperature within the surface of the wafer W become uneven, making it impossible to perform a uniform thermal processing and thus necessitating the replacement of the second dielectric plate 5. If the first dielectric plate 4 is configured to be freely removable, the second dielectric plate 5 alone can therefore be replaced, which is more advantageous than an integral structure.

Since the temperature of the rear surface side of the first dielectric plate 4 is made much lower, as described above, a member constructed of a material that has a low thermal resistivity, such as pure aluminum or resin, can be used on the lower side of that dielectric plate 4.

Figure 5:
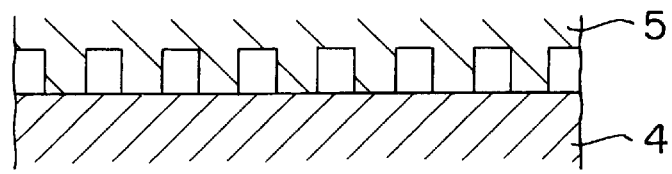
FIG. 5 is a sectional view of another example of the mounting stand used in the vacuum processing apparatus of this invention.
Figure 6:
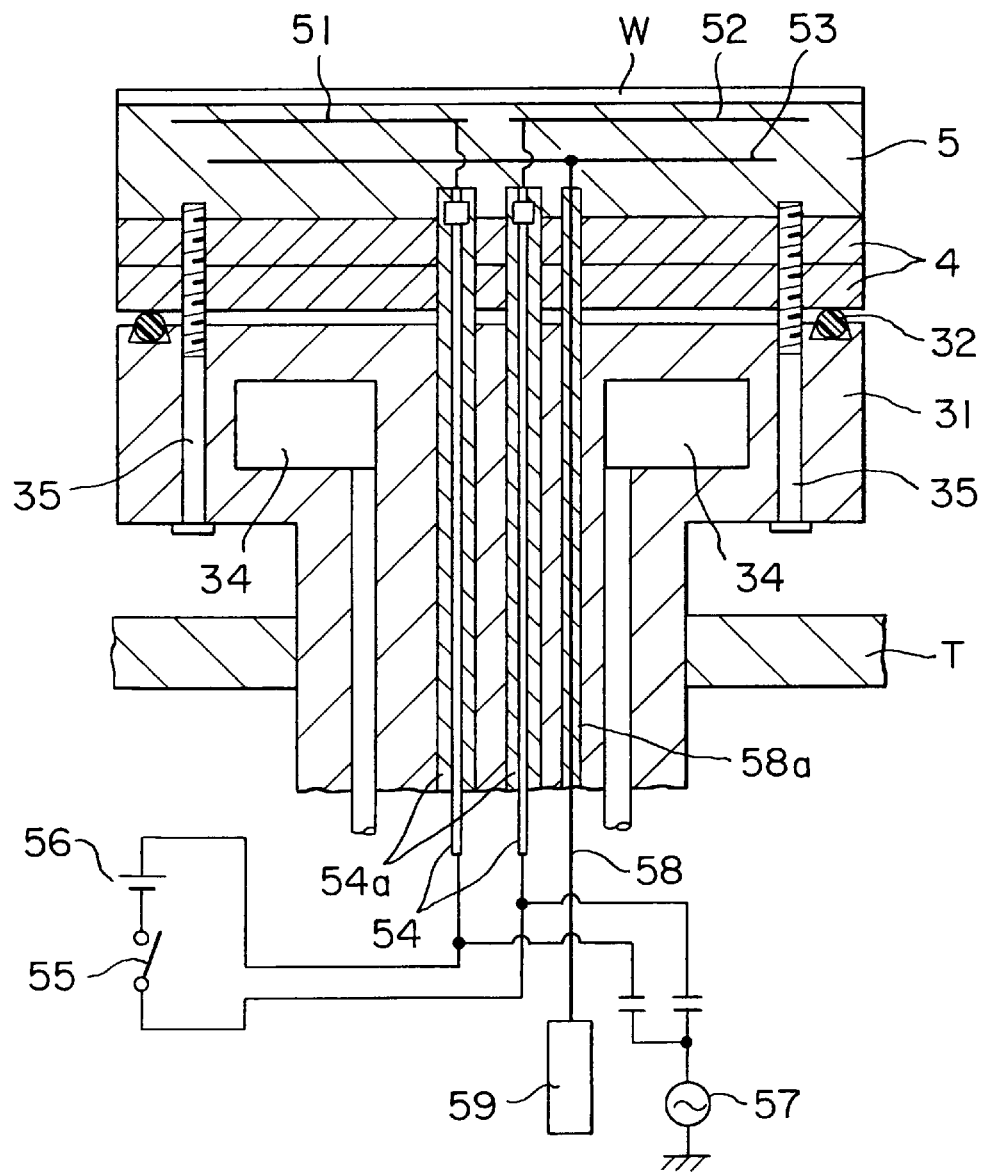
FIG. 6 is a sectional view of yet another example of the mounting stand used in the vacuum processing apparatus of this invention.
Figure 7:
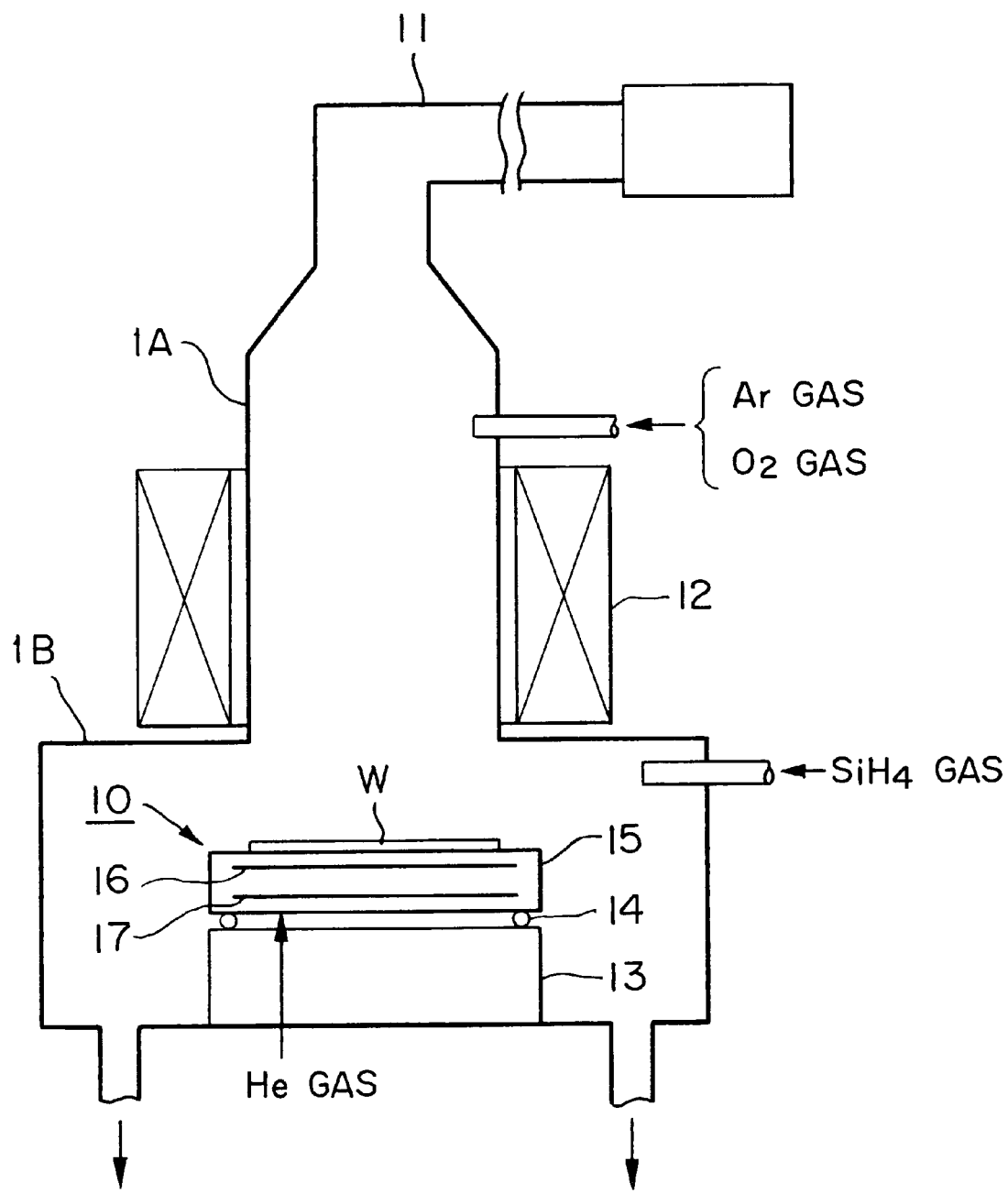
FIG. 7 is a sectional view of a conventional ECR plasma apparatus.

If a configuration that is suitable for that between the second dielectric plate 5 and the main mounting stand unit 31 of the conventional apparatus (a structure that does not employ the first dielectric plate 4) is used for the connection between the first dielectric plate 4 and the second dielectric plate 5, the surface of the main mounting stand unit 31 is a cooled surface at approximately 150° C. that forms a reference for temperatures in the apparatus, there is thus a large temperature difference between the surface of the second dielectric plate 5 and the surface of the main mounting stand unit 31, so that the difference in thermal conductivity within the surface becomes too great and it becomes difficult to obtain a highly uniform temperature within the surface of the wafer W. In other words, in a structure in which a dielectric plate is in direct contact with the surface of the main mounting stand unit 31, the uniformity of temperature over a reference cooling surface is damaged, and thus problems such as a difficulty in adjusting the temperature occur In the vacuum processing apparatus in accordance with this invention, recesses and projections may equally well be formed in the rear surface side of the second dielectric plate 5, as shown by way of example in FIG. 5. In addition, the intermediate dielectric plate 4 may be configured of a plurality of plate elements, such as two plate elements as shown in FIG. 6, and this configuration makes it possible to further increase the temperature difference between the lowermost surface of the first dielectric plate 4 and the surface of the second dielectric plate 5.

As described above, the present invention suppresses deterioration of the O-ring provided on the mounting stand, even during high-temperature processing, thus making it possible to prevent breakdown of the insulating properties of an insulating film formed on a substrate to be processed.

What is claimed is:

1. A vacuum processing apparatus comprising:
   a vacuum vessel forming a vacuum chamber; and
   a mounting stand for a substrate to be processed, which is provided within said vacuum chamber; said mounting stand comprising:
   a main mounting stand unit;
   a first dielectric plate supported by a surface of said main mounting stand unit;
   an annular sealing member interposed between said surface of said main mounting stand unit and said first dielectric plate; and
   a second dielectric plate supported on a surface of said first dielectric plate and having in an interior thereof heating means and an electrode for forming an electrostatic chuck for attracting a substrate to be processed.

2. The vacuum processing apparatus as defined in claim 1, wherein said first dielectric plate has recesses and projections on the surface thereof.

3. The vacuum processing apparatus as defined in claim 1, wherein recesses and projections are formed in a surface of said second dielectric plate facing said first dielectric plate.

4. The vacuum processing apparatus as defined in claim 1, wherein said second dielectric plate includes a plurality of mutually stacked plate elements.

5. The vacuum processing apparatus as defined in claim 1, wherein said annular sealing member defines a region surrounded thereby, and means for supplying a fluid for thermal conduction into said region is provided.

6. The vacuum processing apparatus as defined in claim 1, wherein said first dielectric plate is removably supported.

7. The vacuum processing apparatus as defined in claim 1, wherein said second dielectric plate is removably supported.

* * * * *